United States Patent [19]

Charpentier

[11] Patent Number: 5,291,018
[45] Date of Patent: Mar. 1, 1994

[54] ROBIGON AND SINUGON; DETECTOR GEOMETRIES

[75] Inventor: Robert Charpentier, Lac St-Charles, Canada

[73] Assignee: Her Majesty the Queen as represented by the Minister of Defence of Her Majesty's Canadian Government, Ontario, Canada

[21] Appl. No.: 12,128

[22] Filed: Feb. 1, 1993

[30] Foreign Application Priority Data

Feb. 3, 1992 [CA] Canada .................................. 2062231

[51] Int. Cl.$^5$ ...................... H01L 31/02; H01L 26/02
[52] U.S. Cl. .................................. 250/332; 250/208.1; 250/370.08
[58] Field of Search .................. 250/208.1, 332, 370.08

[56] References Cited

U.S. PATENT DOCUMENTS 4,551,752  11/1985  Wall et al. ............................ 358/113

FOREIGN PATENT DOCUMENTS 140827  6/1986  Japan .............................. 250/208.1

OTHER PUBLICATIONS

SPIE vol. 685 Infrared Technology XII(1986) "Sampling Effects in CdHgTe Focal Plane Arrays-Practical Results"; by R. J. Dann et al, pp. 123 to 128.
Optica Acta, 1982, vol. 29, No. 1, pp. 41-50, "The Definition of the OTF and the Measurement of Aliasing for Sampled Imaging Systems;" Wittenstein et al.
Applied Optics, vol. 19, No. 13, Jul. 1, 1980 pp. 2174 to 2181, "Aliasing and Blurring in 2-D Sampled Imagery," F. O. Huck et al.

*Primary Examiner*—Carolyn E. Fields
*Attorney, Agent, or Firm*—Nixon & Vanderhye

[57] ABSTRACT

Standard mosaic geometries in modern imaging systems, such as a thermal imager, give rise to the fundamental limitation of creating undersampled images that are degraded by aliasing which is a distortion affecting spatial frequency components of the image that are higher than half the sampling frequency. A point target image can either cover one image sensing element and generate a strong single signal or cover up to four adjacent sensing elements which will produce much weaker signals and result in edges of a spread target being degraded by spurious registration. In order to minimize aliasing for a square sampling grid, improved geometries for the detector elements are used which reduce the number of dead zones associated with the current square geometries for the detector elements. One type of geometry for a detector element is a robigon having the form of a polygon obtained by substituting linear sides of a square by a triangular wave shaped edge. This new shape of detector element has the same area as the original square but when closely interfitted with its neighbors forms a mosaic in which all dead zones between the elements are broken into non-linear strips. Similar results are obtained when a sine wave, rather than a triangular wave, shaped side is used to break the normal dead zones that exist between square shaped image sensing elements.

7 Claims, 3 Drawing Sheets

ROBIGON AND SINUGON; DETECTOR GEOMETRIES

FIELD OF THE INVENTION

The present invention relates to image sensors formed by a mosaic of detector elements with a means to minimize aliasing caused by dead zones between the detector elements.

BACKGROUND OF THE INVENTION

Standard mosaic geometries in modern imaging systems, such as a thermal imager, give rise to the fundamental limitation of creating undersampled images, which are degraded by aliasing. This problem is considered to be the most important effect which limits recognition and identification ranges for these systems in various surveillance scenarios.

Aliasing is a distortion affecting spatial frequency components of the image that are higher than half of the sampling frequency. A point target image can either cover one detector element and generate a strong single signal or cover up to four detector elements which will produce much weaker signals from all four elements. Variable registration of the image's continuous signal with the sampling lattice leads to small output signal fluctuations resulting in all edges of a spread target being degraded by the spurious registration.

Two known techniques have been used to, at least partly, solve the aliasing problem. A first solution is called information prefiltering and simply consists in eliminating all frequencies that are higher than half of the sampling frequency. This is realized in imaging systems by matching the blur circle of the optics to an array of at least 2×2 detectors, i.e. each point of the image on the mosaic covers at least 2×2 detectors. This prefiltering of the information provides a good solution to undersampling problems but is, however, extremely expensive to implement since an array of at least 1024×1024 detector elements will be required to obtain a 512×512 image resolution which is about typical for T.V. An array of 1024×1024 detector elements is practically impossible to achieve at present with infrared focal plane arrays of high sensitivity and any array with that number of detectors elements will be extremely expensive to manufacture.

A second solution to reduce the effects of aliasing is to introduce a dithering or microscan into the system. Introducing a scan mirror in the optical path allows multiple images to be formed on the mosaic of detector elements with a small displacement between each of the images. A single plane mirror actuated by piezo-ceramic transducers may be used as a microscan mechanism such as that described in an article by R. J. Dann et al on pages 123 to 128 of *SPIE*, Vol. 685, Infrared Technology XII (1986). This mirror causes an image scene to be displaced by some fraction of a pixel with respect to the detector array so that interpixel sampling can occur in both horizontal and vertical directions. For instance if a 2×2 microscan is applied, the first field records the image at a first reference position on array. The image is then displaced by half a pixel to the right to record a second image and then a half a pixel vertically to record a third image. The image is then displaced a half a pixel to the left for recording a fourth image and then vertically to return the image to its original position. These microscan images are electronically merged together as interlaced fields to form a regular full frame image containing the 4 fields for a 2×2 micro scan as previously described. In a similar manner, the image could be displaced by one third of a pixel for each step to implement a 3×3 microscan.

A number of problems are associated with the use of microscan image such as significant sensitivity reduction caused by the use of many fields to build up an image. This severely limits the duration over which the incident radiation power may be integrated resulting in less sensitivity. The imagery produced by microscan systems is also interlaced which is less suitable for automatic recognition systems and other auto-processors used in modern surveillance systems. Furthermore, a prime objective of developing staring systems is the elimination of scanning mechanism in an IR camera to allow smaller, lighter, cheaper and more reliable imaging systems. The introduction of the microscan mirror can generally be considered as a retrograde step that moves in the opposite direction desired by system designers in that more electronics, more power, more volume and sophisticated mechanics are required to control that type of system.

A hexagonal, rather than square image elements, mesh imaging system has been extensively studied for reasons other than aliasing control. However, the hexagonal mesh cannot easily be addressed by either Cartesian coordinated or polar coordinates. It is, therefore, laborious to use hexagonal meshes with all memory buffers and most image processing algorithms since they rely on Cartesian coordinate systems. Furthermore, the size of detector elements in a hexagonal mesh is less than that for square detector element resulting in a loss of sensitivity.

SUMMARY OF THE INVENTION

It is an object of the present invention to minimize aliasing associated with mosaic type image sensors while avoiding or at least minimizing previously described problems associated with known systems. The use of improved geometries for the detector elements provides an acceptable and economical solution to reduce the impact of "dead zones" in an array of detectors in order to minimize aliasing.

An imaging sensor, according the present invention, consists of a mosaic of detector elements with each element having a similar shaped geometry and a centre, the elements having closely interfitted outer edges arranged in an array such that the centres of adjacent interfitted elements are located on a straight line, the straight lines being parallel to adjacent straight lines interconnecting other centres and to a straight line on which outermost points of the elements are located wherein all the outer edges of each element are generally inclined at an angle to said straight lines.

BRIEF DESCRIPTION OF THE DRAWINGS

The invention will now be described in more detail with reference to the accompanying drawings, in which.

DESCRIPTION OF THE PREFERRED EMBODIMENTS

Figure 1:
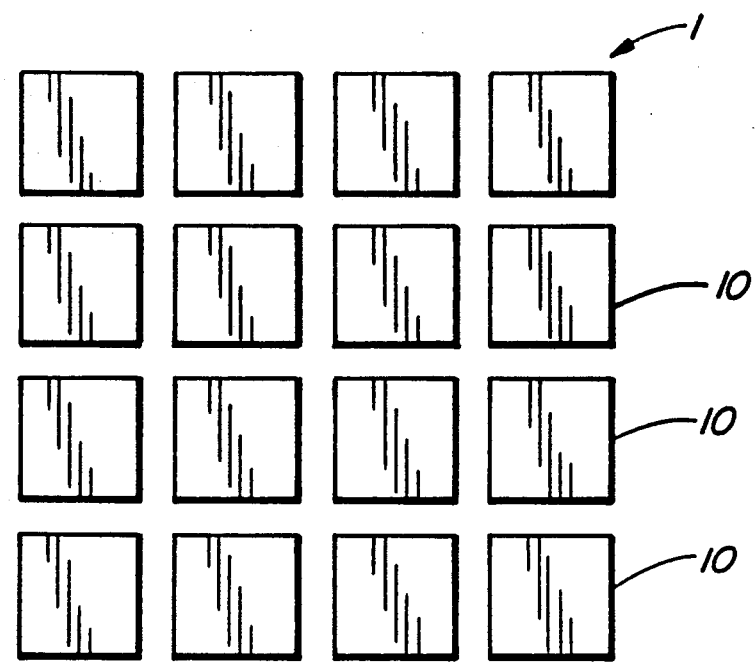
FIG. 1 illustrates a known array of square shaped detector elements.
Figure 2:
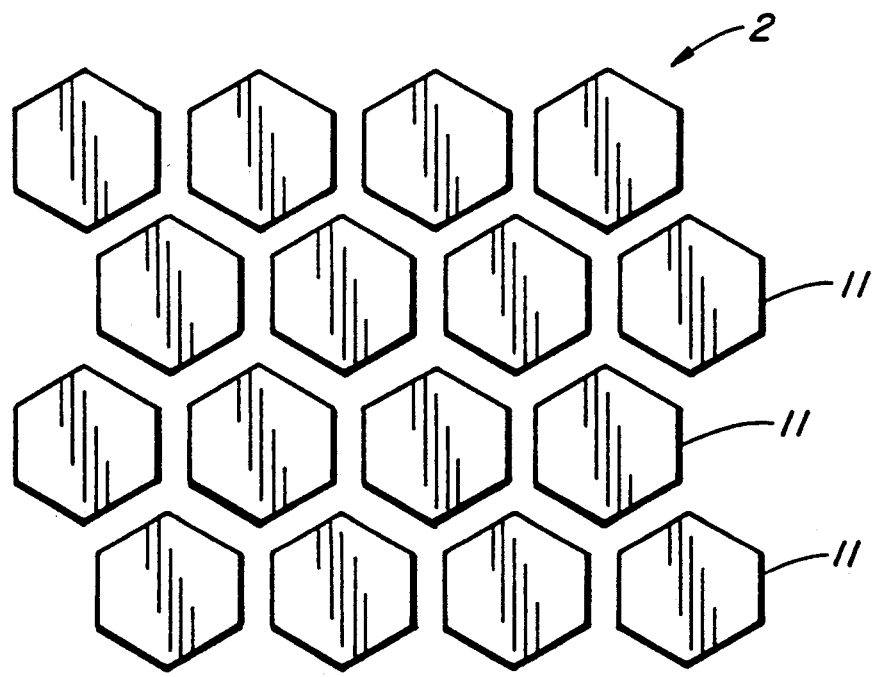
FIG. 2 illustrates a known array of hexagonal shaped detector elements.

FIG. 1 shows a known type of image sensor 1 formed by an array of square shaped detector elements 10 whereas FIG. 2 shows a known type of array 2 formed of hexagonal shaped detector elements 11. These elements form a mosaic on which an image can be focused and any charge created on individual elements, by that image, can be read out to form a signal which can be further processed electronically. All points of illumination formed by the image may fall on one individual detector or, depending on the size of the points, fall on a number of adjacent detector elements.

In the case of square shaped detector elements 10 as shown in FIG. 1, a strong output signal can be received from an element if a point light source is located entirely on one detector element and this strong output signal can be easily processed electronically. However, if the same point source of illumination is located so that it falls onto 4 different sensor elements only a weak signal may be obtained from each element. These weak signals are more difficult to process and may be sufficiently weak so as to create a "dead zone" in the reproduced image which will result in edges of spread targets being severely affected by aliasing. An array of hexagonal elements 11 may partially avoid this situation since straight line spaces between the detector elements will no longer exist as illustrated in FIG. 2. However, an array of hexagonal elements has disadvantages in that it is not easily addressed by either Cartesian or polar coordinates. Furthermore, it is less sensitive due to the smaller active surface area of the elements compared to square shaped detector elements.

Figure 3:
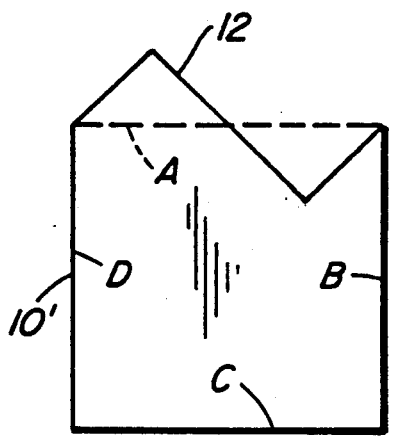
FIG. 3 shows a square shaped detector element with one side changed to illustrate a first embodiment of the present invention.
Figure 4:
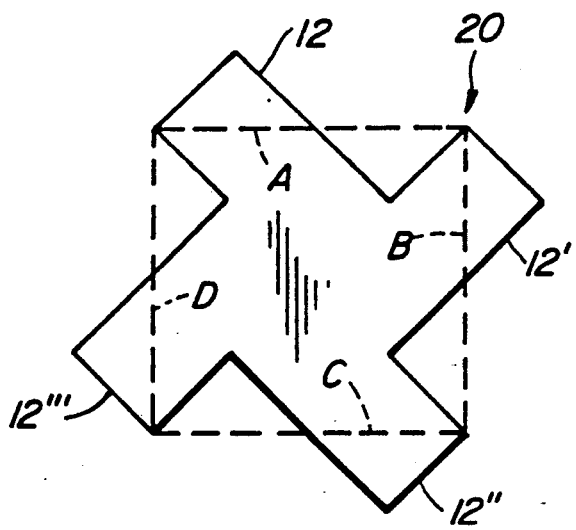
FIG. 4 shows the geometric shape of one detector element according to the first embodiment.
Figure 5:
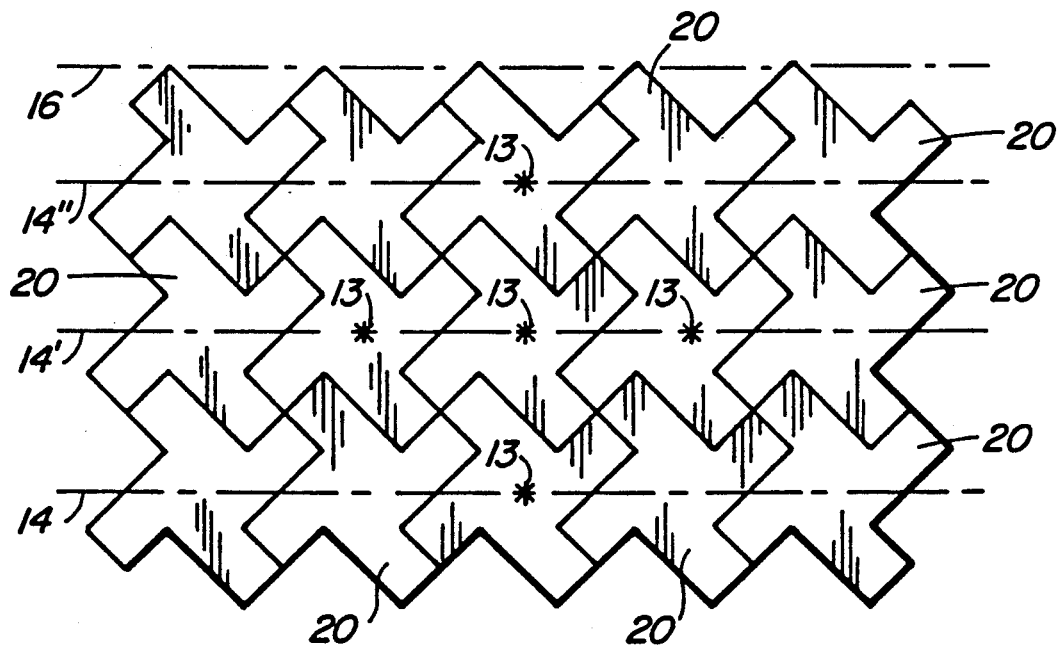
FIG. 5 shows a mosaic of interfitted detector elements according to the first embodiment.

A first embodiment of the invention is illustrated in FIGS. 3 to 5 which show a geometric shape for detector elements that can minimize aliasing for a square sampling grid image sensor. A square shaped detector element 10', with sides A, B, C and D has, as shown in FIG. 3, one side "A" replaced by a triangular or sawtoothed shaped edge 12 to more clearly illustrate how a "robigon" shaped detector element 20 is formed. A "robigon" is a polygon obtained by substituting linear sides of a square (or rectangle) by a triangular wave. A "robigon" shaped detector element 20 is shown in FIG. 4 wherein all linear sides A, B, C and D of a square shaped detector have been replaced by sawtooth waveform shaped sides 12, 12', 12" and 12''' respectively. This new polygon 20 has the same total area as the original square element 10' and, as a result, the same overall sensitivity as the square shaped detector element. The "robigon" also provides a shape whose sides can be closely interfitted with sides of adjacent detectors 20 as shown in FIG. 5 to form an image sensing mosaic 3. In mosaic 3, the center 13 of each element 20 is located on one of the horizontal parallel straight lines 14, 14', 14" which lines are also parallel to a straight line 16 that lies on the uppermost points of the mosaic 3. Each element 20 in FIG. 5 is closely interlaced with its neighbours allowing a geometrical prefiltering in the sampling lattice 3 since all the "dead zones" are broken into non-linear strips.

Figure 6:
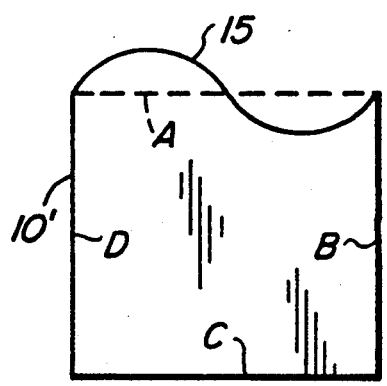
FIG. 6 shows a square shaped detector element with one side changed to illustrate a second embodiment of the present invention.
Figure 7:
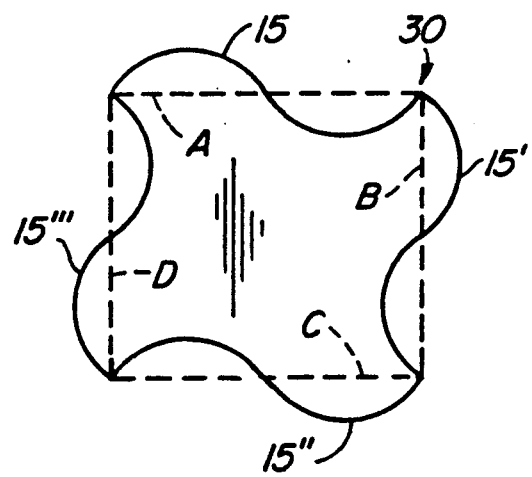
FIG. 7 shows the geometric shape of one detector element according to the second embodiment.
Figure 8:
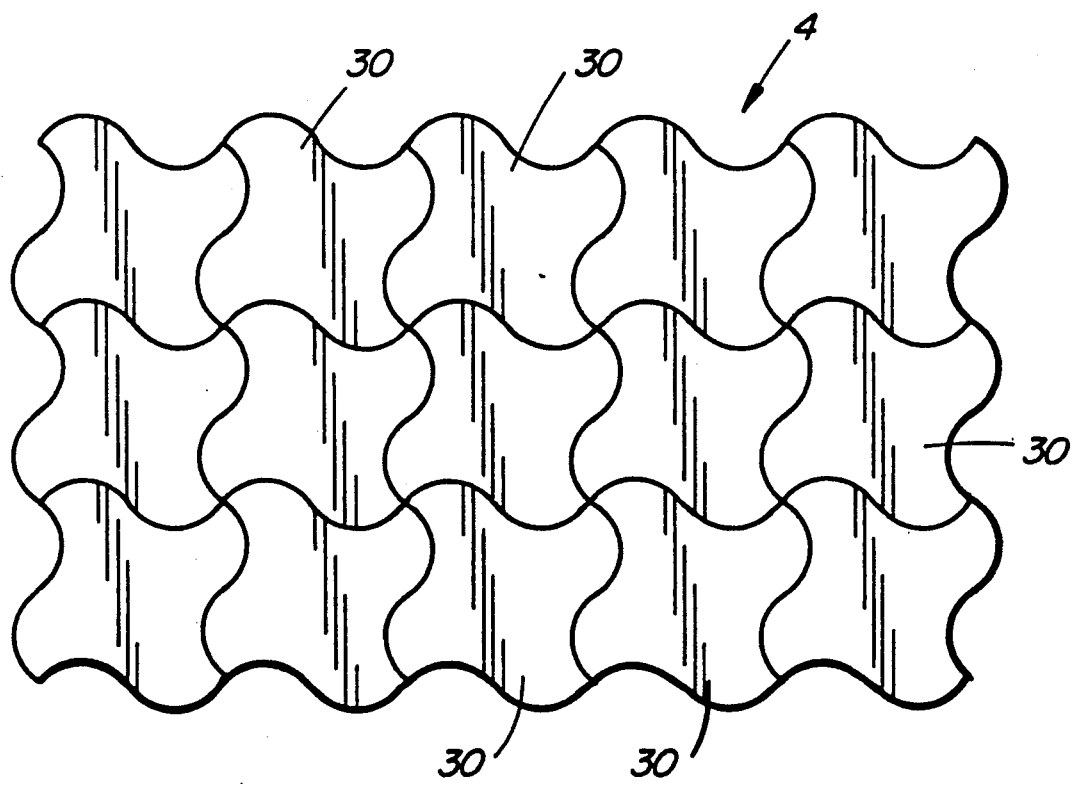
FIG. 8 shows a mosaic of interfitted detector element according to the second embodiment of the invention.

According to a second embodiment of the invention, which is illustrated in FIGS. 6 to 8, similar results are obtained when the linear sides of a square element 10', or rectangle, are replaced by sine wave shaped sides. In this case, linear sides "A" to "D" of a square detector have been replaced by full cycle sine wave shaped sides 15 to 15''' forming a "sinugon" as shown in FIG. 7. These "sinugon" elements 30 can be arranged, as shown in FIG. 8, in a closely interfitted mosaic 4 similar to the mosaic 3 shown in FIG. 5.

The amount of energy aliased for the regular square, the robigon and the sinugon have been evaluated and compared by computer simulation. These simulations test, with different fill factors, demonstrated a significant reduction of aliasing obtained with the new robigon and sinugon geometries. Subjective evaluation of sampled imagery also confirms the high capabilities of these geometries to maintain edges in sampled imagery.

Various modification may be made to the preferred embodiments without departing from the spirit and scope of the invention as defined in the appended claims.

The embodiments of the invention in which an exclusive property or privilege is claimed are defined as follows:

1. An image sensor comprising a mosaic of radiation detector elements with each element having a similar shaped geometry and a center, the elements having closely interfitted outer edges are located on a straight line, the straight lines being parallel to adjacent straight lines interconnecting centers of other elements and to a straight line on which outermost points of the mosaic are located and wherein all the outer edges of each element are generally inclined at an angle to said straight lines.

2. An image sensor as defined in claim 1, wherein each outer edge has the shape of a sine wave.

3. An image sensor as defined in claim 2, wherein each outer edge has the shape of a full cycle of a sine wave.

4. An image sensor as defined in claim 1, wherein the outer edges of the elements are linear, the linear outer edges being inclined to the straight lines forming sawtooth shaped outer edges.

5. An image sensor as defined in claim 4, wherein the outer edges are at an angle of 45° to the parallel straight lines and each outer edge is at an angle of 90° to each adjacent outer edge.

6. An image sensor as defined in claim 1, wherein the detector elements have the shape of a robigon.

7. An image sensor as defined in claim 1, wherein the detector elements have the shape of a sinugon.

* * * * *

UNITED STATES PATENT AND TRADEMARK OFFICE
CERTIFICATE OF CORRECTION

PATENT NO. :     5,291,018
DATED      :     March 1, 1994
INVENTOR(S) :    CHARPENTIER It is certified that error appears in the above-indentified patent and that said Letters Patent is hereby corrected as shown below:

Column 4, line 38:
Claim 1, after "closely interfitted outer edges" insert

--arranged such that the centers of adjacent interfitted elements--.

Signed and Sealed this

Nineteenth Day of July, 1994

Attest:

BRUCE LEHMAN

*Attesting Officer*          *Commissioner of Patents and Trademarks*